(12) United States Patent
Liang et al.

(10) Patent No.: US 8,008,170 B2
(45) Date of Patent: Aug. 30, 2011

(54) METHOD FOR MANUFACTURING SEMICONDUCTOR DEVICE

(75) Inventors: Ji-Hao Liang, Tokyo (JP); Takako Chinone, Tokyo (JP); Yasuyuki Shibata, Tokyo (JP); Jiro Higashino, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 73 days.

(21) Appl. No.: 12/636,934

(22) Filed: Dec. 14, 2009

(65) Prior Publication Data
US 2010/0148309 A1   Jun. 17, 2010

(30) Foreign Application Priority Data
Dec. 17, 2008   (JP) .................................. 2008-321140

(51) Int. Cl.
| H01L 21/36 | (2006.01) |
| H01L 21/20 | (2006.01) |
| H01L 29/04 | (2006.01) |
| H01L 31/036 | (2006.01) |
| H01L 33/00 | (2010.01) |

(52) U.S. Cl. .... 438/481; 438/478; 257/64; 257/E33.005
(58) Field of Classification Search .................. 438/481, 438/478; 257/64, E33.005
See application file for complete search history.

(56) References Cited

U.S. PATENT DOCUMENTS

| 6,153,010 A * | 11/2000 | Kiyoku et al. ................... 117/95 |
| 6,861,305 B2 * | 3/2005 | Koike et al. ..................... 438/200 |
| 6,940,098 B1 * | 9/2005 | Tadatomo et al. ............... 257/87 |
| 7,053,420 B2 * | 5/2006 | Tadatomo et al. ............... 257/98 |
| 7,141,444 B2 * | 11/2006 | Koike et al. ...................... 438/34 |
| 7,682,944 B2 * | 3/2010 | Brandes et al. ............... 438/478 |
| 7,847,293 B2 * | 12/2010 | Haskell et al. ................... 257/64 |

FOREIGN PATENT DOCUMENTS

| JP | 3930161 B2 | 1/2000 |
| JP | 2001-036139 A | 2/2001 |
| JP | 2006-315895 A | 11/2006 |

* cited by examiner

*Primary Examiner* — Luan C Thai
(74) *Attorney, Agent, or Firm* — Holtz, Holtz, Goodman & Chick, PC

(57) ABSTRACT

There is provided a method for manufacturing a semiconductor device in which a selective growth mask for partially covering a growth substrate is formed on a growth substrate; a buffer layer that is thicker than the mask is formed on a non-mask part not covered by the mask on the growth substrate, and a predetermined facet is exposed on the surface of the buffer layer; a semiconductor film is laterally grown using the buffer layer as a starting point, and a lateral growth layer for covering the mask is formed while cavities are formed on the upper part of the mask; and a device function layer is epitaxially grown on the lateral growth layer. The cavity formation step includes a first step for growing a semiconductor film at a growth rate and a second step for growing another semiconductor film at another growth rate mutually different from the first growth rate, wherein the first and second steps are carried out a plurality of times in alternating fashion.

10 Claims, 10 Drawing Sheets

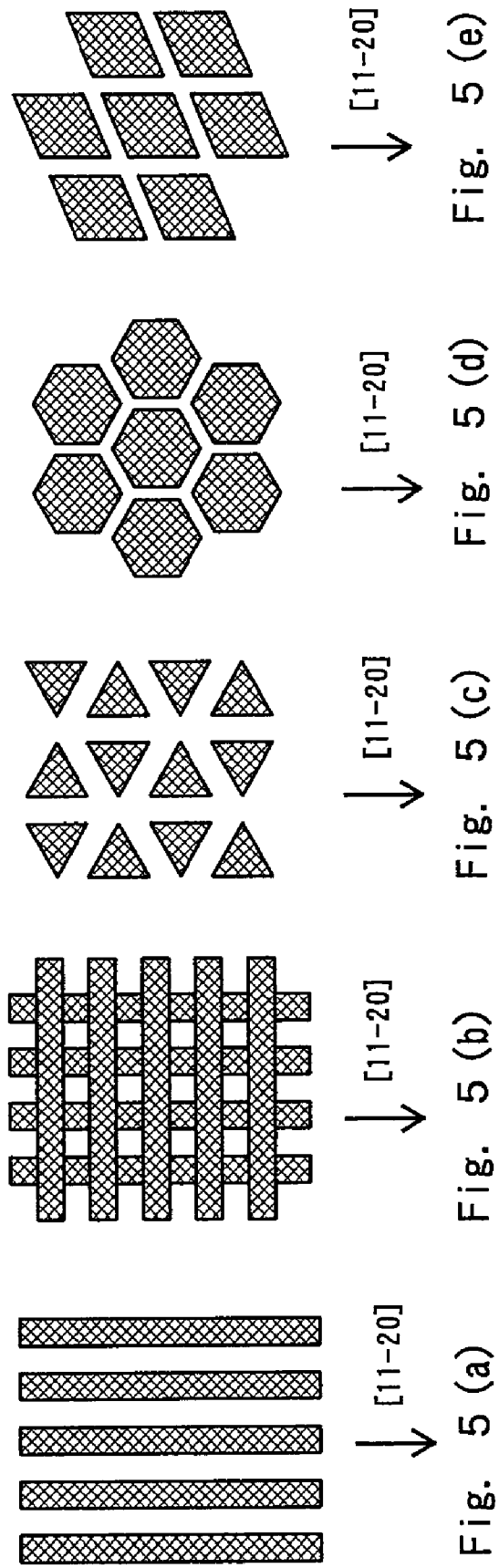

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Related Art

Semiconductor light-emitting devices are increasingly efficient and have higher output due to recent technological advances. However, the amount of heat produced by the semiconductor light-emitting devices has also increased together with the higher output, which causes problems in that the semiconductor light-emitting devices are less efficient, the semiconductor film degrades, and reliability is otherwise reduced. In order to solve this problem, a configuration is used in which a growth substrate having relatively low thermal conductivity is removed, and a semiconductor film supported by a metal having relatively high thermal conductivity is used instead. Heat dissipation of the semiconductor light-emitting device is improved by adopting such a structure, and improvement in light-emission efficiency, more particularly, light extraction efficiency can be expected by removing the growth substrate. In other words, it is possible to reduce light absorption that occurs when light passes through the growth substrate, and to reduce the light component that is totally reflected at the interface between the semiconductor film and the growth substrate due to the refractive index difference. It is a general practice to peel the growth substrate away using a laser lift off (LLO) method.

References 1 and 2 (Japanese Laid-open Patent Application Nos. 2006-315895 and 2001-36139) described methods for peeling away the growth substrate without the use of a laser lift off method. The method for manufacturing a semiconductor device of Japanese Laid-open Patent Application No. 2006-315895 is described below. First, a $SiO_2$ mask is formed in a striped arrangement on the growth substrate. Next, a GaN film is selectively grown on the open parts of the mask. The wafer is subsequently removed from a HVPE apparatus before mutually adjacent GaN films between the masks completely fuse together, and cavities are formed inside the GaN film by etching away the mask. The wafer is then set again in the HVPE apparatus and the GaN film is grown further while the cavities are maintained. The sapphire substrate is thereafter peeled away from the GaN film using the difference in the thermal expansion coefficients of the GaN film and the sapphire substrate when the ambient temperature is reduced.

On the other hand, the method for manufacturing a semiconductor device of Japanese Laid-open Patent Application No. 2001-36139 is described below. A separating layer in which aluminum nitride or the like is dispersed and arranged as islands is formed between the sapphire substrate and the semiconductor crystal layer. An etchant is caused to flow into the cavities formed in the separating layer, and the sapphire substrate is peeled away by etching away the separating layer.

Since there is a considerable difference in the number of grid shapes between the sapphire substrate and the crystals of the GaN or other group III nitride semiconductor, there are numerous crystal defects in the crystals of the group III nitride semiconductor grown on the sapphire substrate. Epitaxial lateral overgrowth (ELOG) is an effective response to this problem. This method entails, e.g., forming on the surface of the sapphire substrate a selective growth mask composed of $SiO_2$ or the like having open parts, and growing the III group nitride semiconductor crystals in the lateral direction from the mask openings to deflect dislocation, thereby shielding against propagation of penetrating migration to the upper layer (Reference 3: Japanese Patent No. 3930161).

When the growth substrate is peeled away using the LLO method, the nitride semiconductor, which has absorbed laser light, decomposes and produces $N_2$ gas, there are cases in which the gas pressure produces cracks in the semiconductor film, and the heat produced by the absorption of laser light causes a degradation of the crystal quality of the semiconductor film. This leads to higher costs because expensive special equipment must be used in order to carry out the LLO method. It is furthermore difficult to process a plurality of wafers in a single process using the LLO method, and the process entails scanning a laser light across the entire wafer surface. Therefore, a relatively long processing time is required. The processing time is further extended as the diameter of wafers is increased. Therefore, it is thought that there are many advantages in terms of quality, cost, processing time, and other aspects when the growth substrate is readily peeled away by wet-etching or applying external force.

In accordance with Japanese Laid-open Patent Application Nos. 2006-315895 and 2001-36139, the growth substrate can be peeled away without using an LLO method. However, in the manufacturing method described in Japanese Laid-open Patent Application No. 2006-315895, the wafer is temporarily removed from the HVPE apparatus and the mask is etched away in order to form cavities inside the GaN film, after which the wafer is set again in the HVPE apparatus to grow the GaN film. Therefore, the steps become complicated and considerable processing time is required. In the manufacturing method described in Japanese Laid-open Patent Application No. 2001-36139, the semiconductor crystal layer is grown from the separating layer, and a GaN semiconductor crystal layer is not readily epitaxially grown on the separating layer even using a buffer layer, depending on the film formation conditions and the material of the separating layer.

In the ELOG technique that is used in conjunction with selective growth, there are cases in which cavities are formed on the mask, and it is possible to consider a method in which these cavities are used as etchant introduction channels for peeling away the growth substrate. However, since there has been no attempt to use the cavities obtained as a result of the lateral growth of the GaN crystals as an etchant introduction channel, a method for controlling the surface area of the openings of the cavities, the shape of the openings, and the like mostly remains unresearched. In other words, cavities obtained by a conventional method of lateral growth do not have the required opening surface area and opening width to adequately function as an etchant introduction channels.

SUMMARY OF THE INVENTION

The present invention was contrived in view of the foregoing, and an object of the present invention is to provide a method for manufacturing a semiconductor device in which a growth substrate can be readily peeled away by wet-etching or the application of external force by forming cavities having a large opening surface area inside the semiconductor layer using the ELOG technique.

The method for manufacturing a semiconductor device of the present invention is a method for manufacturing a semiconductor device using an organometallic vapor phase growth method, comprising a step for forming on a growth substrate a selective growth mask for partially covering the growth substrate; a step for forming a buffer layer with a greater thickness than that of the mask and having a facet on the surface, in the non-mask part that is not covered by the mask on the growth substrate; a cavity formation step for growing a lateral growth layer on the buffer layer and forming cavities on the upper part of the mask; and a step for epitaxially growing a device function layer on the lateral growth layer, wherein the cavity formation step includes a first step for growing a semiconductor film at a growth rate and a second step for growing another semiconductor film at another growth rate mutually different from the first growth rate, wherein the first and second steps are carried out a plurality of times in alternating fashion.

The semiconductor device of the present invention is a semiconductor device in which a device function layer having a group III nitride semiconductor is formed on a growth substrate, the semiconductor device comprising a cavity-containing layer having a group III nitride semiconductor that has a plurality of cavities between the growth substrate and the device function layer, wherein each of the cavities has a sidewall having of the {11-22} plane of the group III nitride semiconductor crystal.

In accordance with the method for manufacturing a semiconductor device of the present invention, it is possible to form a layer having cavities with large opening surface areas and opening widths that are advantageous for peeling away the growth substrate, and it is also possible to readily peel away the growth substrate using a method other than the LLO method.

BRIEF DESCRIPTION OF THE DRAWINGS

The aforementioned aspects and other features of the invention are explained in the following description, taken in connection with the accompanying drawing figures wherein:

FIGS. 5(a) through 5(e) are plan views showing a configuration example of the $SiO_2$ as an example of the present invention;

DESCRIPTION OF THE PREFERRED EMBODIMENTS

Figure 1:
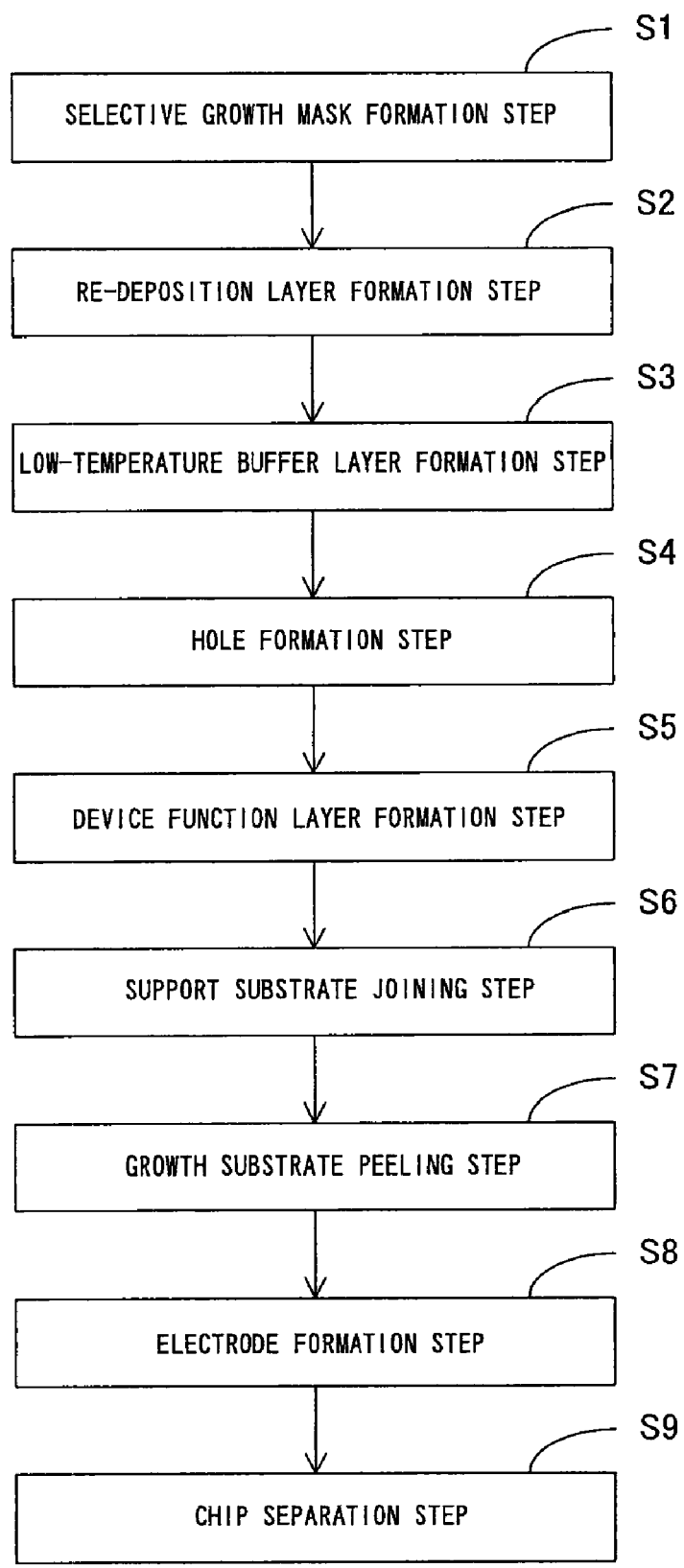
FIG. 1 is a flowchart of the steps for manufacturing a semiconductor device as an example of the present invention.
Figure 2:
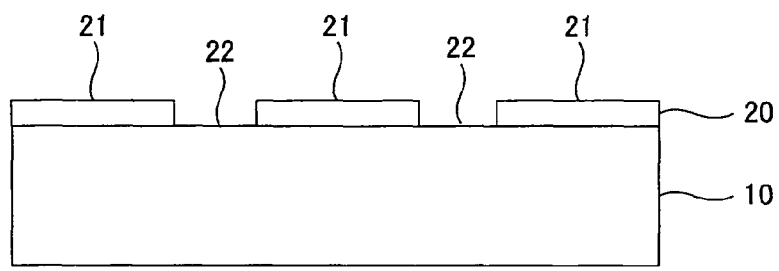
FIGS. 2(a) through 2(e), FIGS. 3(f) through 3(h), and FIGS. 4(i) through 4(k) are cross-sectional views of each manufacturing step of the semiconductor device as an example of the present invention.
Figure 2:
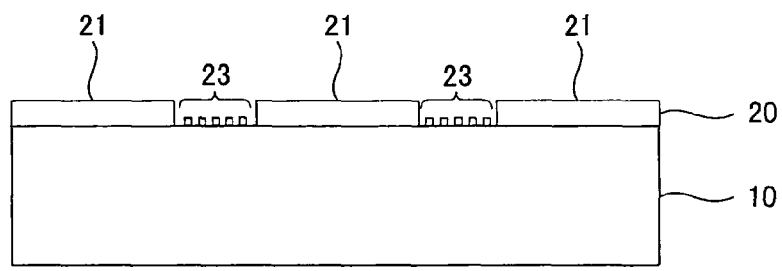
Figure 2:
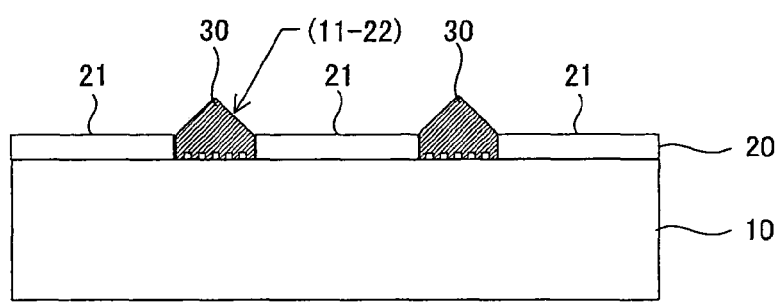
Figure 2:
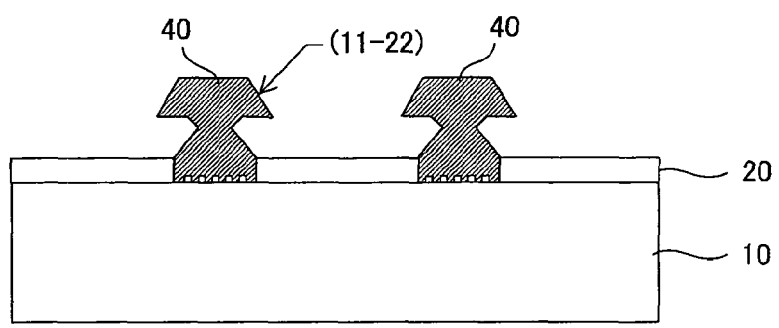

Examples of the present invention are described below with reference to the drawings. FIG. 1 is a flowchart of the steps for manufacturing a semiconductor light-emitting device as an example of the present invention. FIGS. 2 through 4 are cross-sectional views of each manufacturing step of the semiconductor light-emitting device as an example of the present invention.

(Selective Growth Mask Formation Step: Step S1)

First, a growth substrate is prepared. Used as the growth substrate in the present example is a c-plane sapphire substrate 10 in which the c-plane is used as the crystal growth plane in which a GaN-based semiconductor epitaxial layer can be formed by metalorganic vapor phase deposition (MOCVD).

Next, a mask layer is formed in order to selectively grow a GaN film on the sapphire substrate 10. The mask layer is composed of a $SiO_2$ mask 20 arrayed in a striped fashion in the sapphire substrate 10. The sequence for forming the mask layer is as follows. First, a $SiO_2$ film having a thickness of about 150 nm is deposited on the sapphire substrate 10 using an EB (electronic beam) method or the like. A resist mask is subsequently formed on the $SiO_2$ film, after which a striped pattern is formed by selectively removing the $SiO_2$ film by dry etching using, e.g., $CHF_3$. In the present example, the $SiO_2$ film is removed by a width of 1 μm, and a striped pattern in which a mask part 21 and non-mask part 22 are arranged in alternating fashion is formed by removing the $SiO_2$ film by a width of 3 μm. In other words, a $SiO_2$ mask having a width of 3 μm is formed at a pitch of 4 μm on the sapphire substrate 10. At this point, patterning is preferably carried out so that the direction in which the mask part 21 extends is parallel to the <11-20> (a axis) of the crystal orientation of the sapphire substrate 10. Growth in the transverse direction of the GaN film is facilitated by arranging the $SiO_2$ film in this manner (FIG. 2(a)).

In the present example, a mask layer is formed using $SiO_2$, but any material that allows selective growth of the GaN film can be used, and other examples include $TiO_2$, SiN, and TiN. The thickness of the $SiO_2$ film can be formed in a range of, e.g., 100 to 500 nm, but the thickness is preferably 100 to 200 nm when consideration is given to the growing time and facilitating the growth of the GaN film.

The method for forming the $SiO_2$ film is not limited to the EB method; examples of other methods that may be used include sputtering, plasma CVD, and thermal CVD. The etching of the $SiO_2$ film is not limited to dry etching using $CHF_3$; dry etching using $CF_4$, $C_2F_8$, or the like may be used. It is also possible to perform wet etching using HF, BHF, $NH_4F+HF$, KOH, NaOH (oxide), hot phosphoric acid, phosphoric acid+sulfuric acid (nitride), or the like.

The $SiO_2$ mask may be discretely formed at suitable intervals on the sapphire substrate 10, and in addition to a striped pattern, it is also possible to use a pattern in which a triangular shape, a hexagonal shape, a rhomboid shape, or another polygonal shape is arrayed in the form of a lattice, the polygonal shape having a side parallel to the axis that is parallel to the crystal orientation <10-10> of the GaN crystal or to an axis equivalent thereto, as shown in FIGS. 5(a) through 5(d). The Miller index enclosure "< >" is used to indicate the set of all equivalent directions.

The $SiO_2$ mask may be obtained by first forming a pattern using a photoresist on the sapphire substrate 10, then depositing the $SiO_2$ film, and lifting off the unneeded portions deposited on the resist mask.

The growth substrate is not limited to a sapphire substrate, and it is also possible to use a substrate suitable for growing GaN on a Si or SiC substrate or another semiconductor substrate.

(Re-Deposition Layer Formation Step: Step S2)

Next, the sapphire substrate 10 on which the SiO$_2$ mask 20 was formed is set in a MOCVD apparatus set to 1,000° C., and processed for seven minutes in a reduced atmosphere (hydrogen flow rate: 10 LM; nitrogen flow rate: 7 LM). The SiO$_2$ constituting the SiO$_2$ mask 20 is decomposed and desorbed from the mask part 21 by exposure to a high-temperature reduced atmosphere. The SiO$_2$ thus desorbed is dispersed in the reduced atmosphere, and a portion of the SiO$_2$ is re-deposited on the sapphire substrate 10, which is the non-mask part 22. This heat treatment is carried out for a suitable length of time, whereby a re-deposition layer is formed on the non-mask part 22 in which re-deposits 23 of SiO$_2$ having a thickness of about several angstroms have been deposited so as to be distributed as islands (FIG. 2(b)).

The re-deposits 23 and the SiO$_2$ mask 20 function as sacrificial films that are etched away in a later growth substrate-peeling step (step S7). The re-deposits 23 of SiO$_2$, which are interposed between the sapphire substrate 10 and the GaN film, are later etched away, thereby facilitating peeling of the sapphire substrate 10.

It is important to uniformly distribute the SiO$_2$ desorbed from the mask part 21 on the non-mask part 22 in order for the re-deposits 23 to function as a sacrificial layer and for the sapphire substrate 10 to be adequately peeled away. This is due to the fact that when regions in which the SiO$_2$ is not re-deposited on the non-mask part 22 increase, the surface area of the bonding part between the sapphire substrate and the GaN film increases and the sapphire substrate 10 may not peel away. The phrase "the SiO$_2$ is uniformly distributed" also refers to a state in which islands of the re-deposits 23 are evenly dispersed on the non-mask part 22, and a SiO$_2$ film is not necessarily required to be formed on the non-mask part 22.

It is important to suitably set the pattern configuration of the SiO$_2$ mask 20; i.e., the width dimensions of the mask part 21 and the non-mask part 22, in order to give the SiO$_2$ re-deposits 23 a uniform distribution on the non-mask part 22. In other words, since the dispersion distance of the desorbed SiO$_2$ is limited, the re-deposits 23 of SiO$_2$ are less likely to be deposited because the center part in the width direction of the non-mask part 22 becomes more distant from the mask part 21 when the separating distance between the mask parts 21; i.e., the width of the non-mask parts 22, is 5 µm or more. Therefore, the width of the non-mask part 22 is set to 5 µm or less, and more preferably 1 µm or less. On the other hand, the width of the mask part 21 is preferably set to 1 to 5 µm with consideration given to manufacturing precision and to forming cavities 41 on the mask part 21 in a later step. It is preferred that the width of the mask part 21 be greater than the width of the non-mask part 22, and that the ratio be about 3:1 to 4:1.

The heat treatment of the present step is preferably carried out in conditions that promote decomposition and desorption of the SiO$_2$, and it is preferred that the treatment take place in a hydrogen-rich reduced atmosphere of 1000° C. or higher. Also, when the GaN film is selectively grown on the sapphire substrate 10 exposed through the non-mask part 22 in a later step, the crystallinities of semiconductor epitaxial layers 50 of the upper layers are negatively affected when the thickness of the re-deposits 23 is excessively great. Therefore, the thickness of the SiO$_2$ re-deposits 23 deposited on the non-mask part 22 is preferably set to 1 nm or less so as to avoid harm to the crystallinity of the GaN film of the upper layers. Accordingly, the treatment time can be suitably set in a range of 1 to 20 minutes so as to achieve a suitable thickness of the re-deposits 23 in accordance with the treatment time, the ambient temperature, the pattern of the SiO$_2$ mask 20, and other factors.

In the present example, the decomposition and desorption of the SiO$_2$ is facilitated by exposing the wafer to a high-temperature hydrogen atmosphere and re-depositing the SiO$_2$ on the non-mask part 22, but it is also possible to carry this out by treatment in a plasma atmosphere in the presence of hydrogen, or by electron irradiation in the present of hydrogen.

(Low-Temperature Buffer Layer Formation Step: Step S3)

Next, a low-temperature buffer layer 30 composed of GaN and having low crystallinity is formed on the sapphire substrate 10 on which the SiO$_2$ mask 20 is formed. The low-temperature buffer layer 30 functions as a buffer layer for alleviating lattice mismatch between the sapphire substrate 10 and the GaN film. In accordance with the research of the present inventors, it is apparent that the surface area of the openings and the shape of the cavities 41 formed on the mask part 21 in a later step can be controlled using the thickness of the low-temperature buffer layer 30. The cavities 41 function as etchant introduction channels for peeling away the sapphire substrate 10 by wet etching in the growth substrate-peeling step (step S7). In the case that the cavities 41 function as etchant introduction channels, the surface area and width of the openings of the cavities 41 are preferably fairly large in order to promote etching. It is apparent that it is best to have the thickness of the low-temperature buffer layer 30 be greater than the thickness of the SiO$_2$ mask 20 when an attempt is made to form cavities having such a large opening surface area and opening width.

Specifically, the temperature inside the MOCVD apparatus is brought to 525° C., trimethylgallium (TMG) (flow rate: 10 µmol/min) and ammonia (NH$_3$) (flow rate: 3.3 LM) are fed (in this case, the V/III ratio is about 14000) in a mixed atmosphere of nitrogen (flow rate: 13.5 LM) and oxygen (flow rate: 7 LM), and a low-temperature buffer layer 30 is formed to a thickness of about 400 nm, which is greater than the thickness (150 nm) of the SiO$_2$ mask 20.

When the GaN film is grown on the sapphire substrate 10 on which the SiO$_2$ mask 20 has been formed in these conditions, a GaN single-crystal film does not grow on the mask part 21, but polycrystals do grow, and GaN nucleation occurs only on sapphire substrate 10 exposed through the non-mask. The ambient temperature is thereafter increased to 800° C., which is the growth temperature in the following cavity formation step (step S4). At this point, the facet {11-22} of a stable GaN crystal is manifest on the surface of the low-temperature buffer layer 30 grown on the sapphire substrate 10. The facet is maintained even in the growth process of a later-described lateral growth layer 40, and the facet constitutes the sidewall of the cavities 41 (FIG. 2(c)). The Miller index enclosures "{ }" show the representative value of an equivalent plane.

In the present step, the ambient temperature can be set in a range of 425 to 625° C. The TMG flow rate can be set in a range of 3 to 45 µmol/min, but is preferably set in a range of 9 to 23 µmol/min in order to increase the formation uniformity of the buffer layer 30 and the crystallinity of semiconductor epitaxial layers 50 of the upper layers (which may be referred to "device function layer 50" hereinbelow). The V/III ratio can be set in a range of 3,000 to 25,000, but the ratio is preferably set to a range of 6,000 to 14,000 in order to increase the crystallinity of the device function layer 50. The flow rate of NH$_3$ can be set in a range of 3.3 to 5.5 LM, in the range of the V/III ratio.

(Cavity Formation Step: Step S4)

A lateral growth layer 40 having a thickness of about 400 nm that will form the cavities 41 on the mask part 21 is formed on the sapphire substrate 10 by repeating in alternating fashion a plurality of cycles of the process for carrying out GaN growth under conditions of relatively low growth speed conditions (referred to as the first step) and the process for carrying out GaN growth under relatively high growth speed conditions (referred to as the second step) to laterally grow the GaN film.

Specifically, the temperature inside the MOCVD apparatus is brought to 800° C., the TMG is fed at a flow rate of 23 μmol/min and $NH_3$ is fed at a flow rate of 2.2 LM in the first step in an atmosphere of nitrogen at a flow rate of 6 LM and hydrogen at a flow rate of 13 LM to grow a GaN film at a growth speed of 23 nm/min. In the first step, the desorption of seed material fed is thus facilitated because the growth speed is relatively low. A facet {11-22} of the GaN crystal is thereafter manifest in the constituent elements of the lateral growth layer 40 that has begun grow on the low-temperature buffer layer 30 (FIG. 2(d)).

Figure 2E:
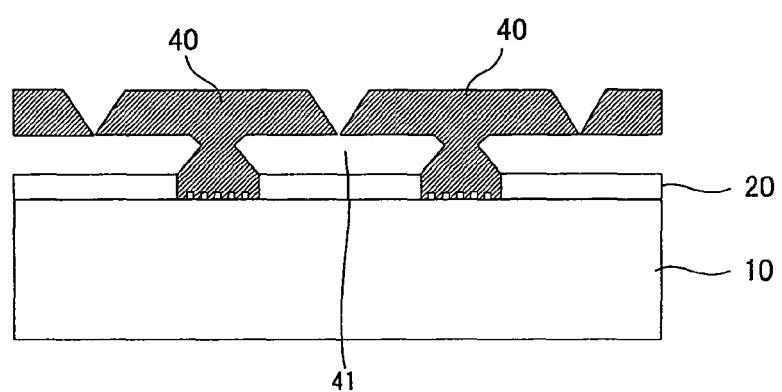

On the other hand, in the second step, TMG is fed at a flow rate of 45 μmol/min, $NH_3$ is fed at a flow rate of 4.4 LM, and a GaN film is grown at a growth speed of 45 nm/min. Since the growth speed is relatively high in the second step, the facet {11-22} formed in the first step grows so as to spread out in the lateral direction (FIG. 2(e)). Thus, the lateral growth of the GaN film is facilitated in the second step. Therefore, the dislocation that occurs at the interface between the sapphire substrate 10 and the GaN film is curved, propagation of the upward dislocation is suppressed, and the dislocation density of the upper layers can be reduced.

Figure 3F:
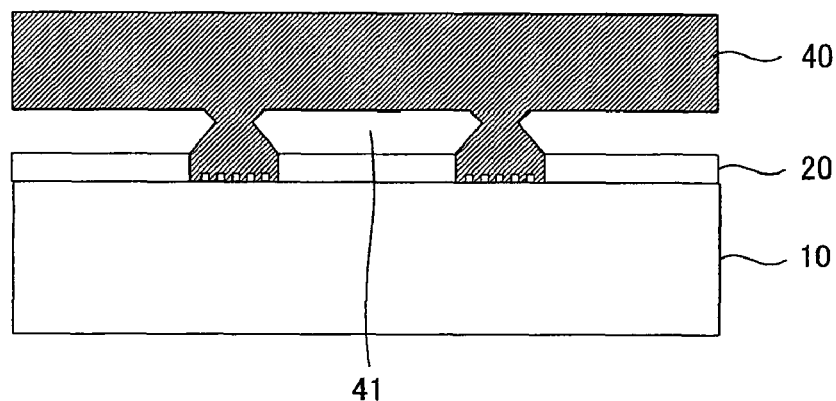
Figure 4I:
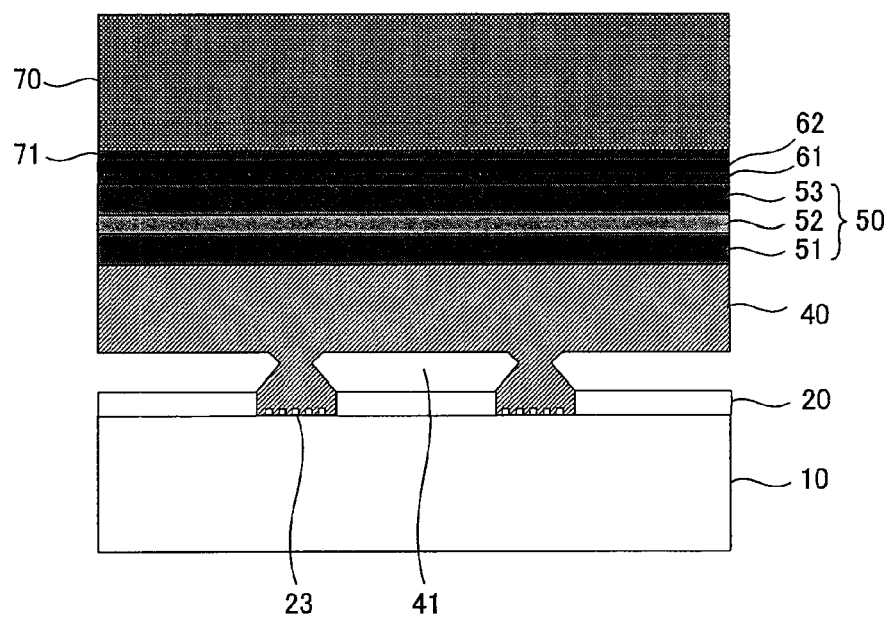
Figure 4J:
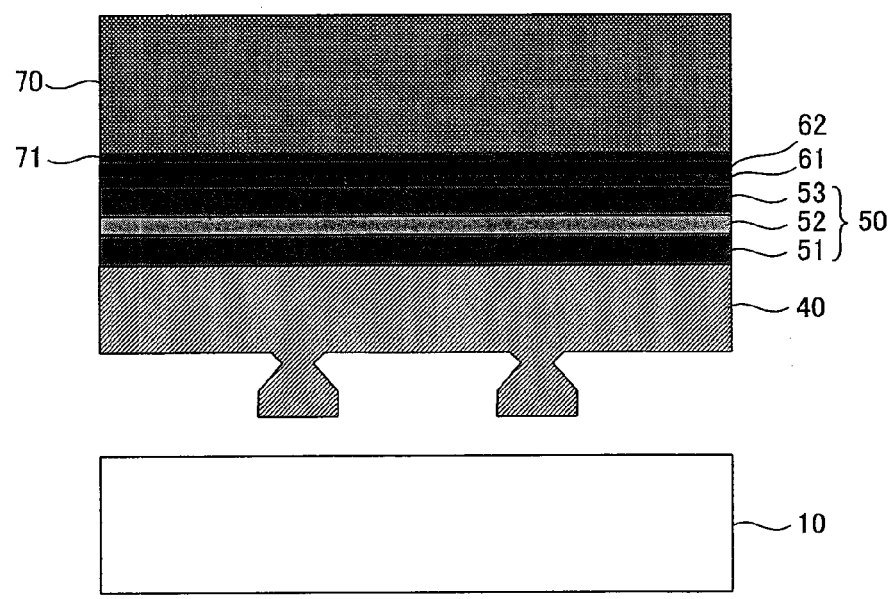

The first and second steps are repeated four times each in alternating fashion, whereby mutually adjacent GaN crystals fuse together and the lateral growth layer 40 for forming the cavities 41 is formed on the upper part of each mask part 21 (FIG. 3(f)).

At this point, the following reaction occurs in the process for repeating the first and second steps and laterally growing the GaN film. The GaN film that constitutes the lateral growth layer 40 grows while the supplied Ga atoms and N atoms are repeatedly adsorbed on the substrate, dissociated, and desorbed on the substrate. The upper part of the mask part 21 is covered by the lateral growth layer 40 and the basic shape of the cavities 41 is progressively formed as the lateral growth proceeds in the second step. The width of the opening part of the upper part of the cavities 41 decreases just before mutually adjacent GaN crystal perfectly fuse together, making it difficult for the seed material gas to enter into the cavities 41. On the other hand, decomposition and desorption proceeds in the portions with weak crystallinity inside the cavities 41, and nitrogen in a gas state escapes from inside the cavities 41 via the opening part. Therefore, the size of the cavities 41 gradually increases and cavities 41 are formed in which the cross section having a greater width than that of the mask part 21 is substantially trapezoidal. A stable facet {11-22} formed in an earlier low-temperature buffer layer formation step is maintained and constitutes the sidewall surfaces of the cavities 41.

Therefore, each of the cavities 41 functions as an etchant introduction channel for introducing etchant into the GaN film when the 10 is to be peeled away by wet etching in the later growth substrate-peeling step (step S7).

The growth temperature in the present step can be set in a range of 700 to 900° C. Also, the growth speed of the GaN film in the first step can be set in a range of 10 to 30 nm/min. The growth speed of the GaN film in the second step can be set in a range of 30 to 70 nm/min. In this case, the ratio of the growth speed in the first step and the growth speed in the second step is preferably kept in a range of about 1:1.5 to 1:4.

(Device Function Layer Formation Step: Step S5)

Figure 3G:
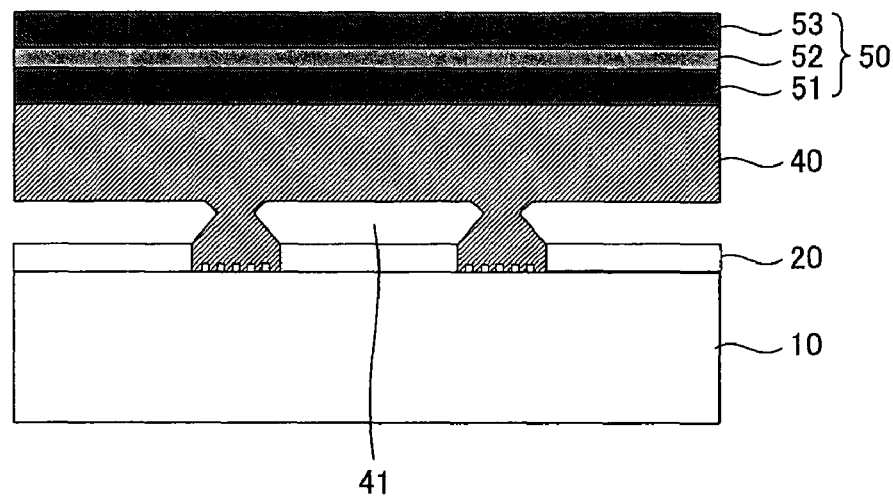
Figure 3H:
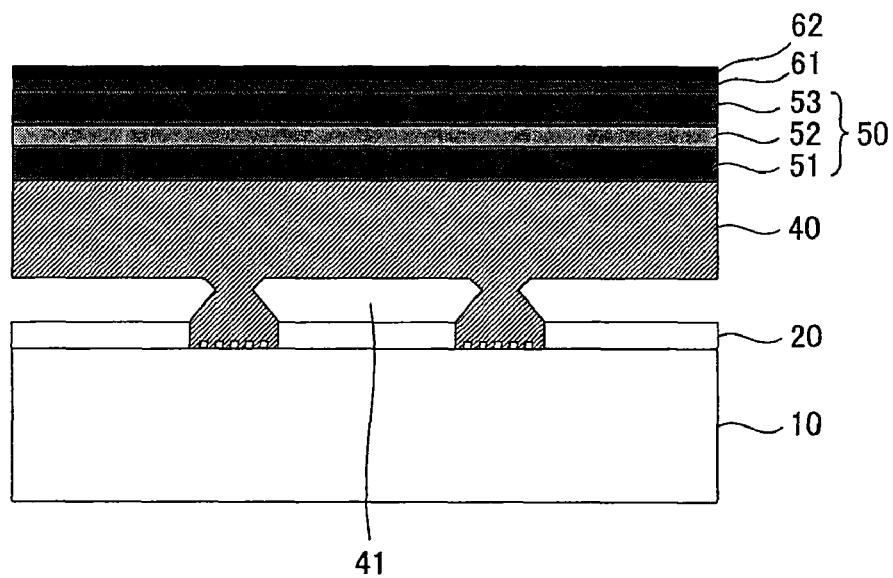

Next, a device function layer 50 composed of light-emission operating layers such as an n layer 51, a light-emission layer 52, and a p-layer 53 respectively composed of GaN-based semiconductors is formed on the lateral growth layer 40 using MOCVD (FIG. 3(g)).

Specifically, the ambient temperature is set to 1000° C., TMG (flow rate: 45 μmol/min), $NH_3$ (flow rate: 4.4 LM), and $SiH_4$ as a dopant gas are fed, and the n layer 51 doped with Si at $5\times10^{18}$ atom/$cm^3$ and having a thickness of about 1 to 10 μm is formed. The flow rate of the TMG can be modified in a range of 10 to 70 μmol/min. The flow rate of $NH_3$ can be modified in a range of 3.3 to 5.5 LM. The V/III ratio can be set in a range of 2,000 to 22,500, and more preferably 3,000 to 8,000.

Next, the ambient temperature is set to 760° C., TMG (flow rate: 3.6 μmol/min), trimethylindium (TMI; flow rate: 3.6 μmol/min), and $NH_3$ (flow rate: 4.4 LM) are fed and 30 pairs of GaN/$In_yGa_{1-y}N$ (both 2 nm) are formed, whereby a strain-alleviating layer (not shown) is formed. The flow rate of TMG and TMI can be modified in a range of 1 to 10 μmol/min. In this case, the flow rates of the TMI and TMG must be simultaneously modified so that the In structure is about y=0.2. The flow rate of $NH_3$ can be modified in a range of 3.3 to 5.5 LM. $In_xGa_{1-x}N$ may be formed in place of GaN. In this case, the flow rate must be adjusted so as to satisfy x<y. The thickness of the strain-alleviating layer can be modified in a range of 50 to 300 nm by modifying the number of pairs and the thickness of each layer of GaN/$In_yGa_{1-y}N$. The strain-alleviating layer may be doped with Si to a maximum of $5\times10^{17}$ atom/$cm^3$.

Next, the ambient temperature is set to 730° C., TMG (flow rate: 3.6 μmol/min), trimethylindium (TMI; flow rate: 10 μmol/min), and $NH_3$ (flow rate: 4.4 LM) are fed and five pairs of a GaN barrier layer/$In_zGa_{1-z}N$ well layer (both 14 nm/2 nm) are formed, whereby a light-emission layer 52 having a multi-quantum well structure is formed. The flow rate of TMG and TMI can be modified in a range of 1 to 10 μmol/min. In this case, the flow rates of the TMI and TMG must be simultaneously modified so that the In structure is about y=0.35. The flow rate of $NH_3$ can be modified in a range of 3.3 to 5.5 LM. The light-emission layer 52 may be doped with Si to a maximum of $5\times10^{17}$ atom/$cm^3$.

Next, the ambient temperature is set to 870° C., TMG (flow rate: 8.1 ηmol/min), trimethylaluminum (TMA; flow rate: 7.6 μmol/min), $NH_3$ (flow rate: 4.4 LM), and CP2MG (bis-cyclopentadienyl Mg) as a dopant gas are fed, whereby a p-$Al_wGa_{1-w}N$ layer (not shown) having thickness of about 40 nm and doped with Mg to $1\times10^{20}$ atom/$cm^3$ is formed. The flow rate of TMG can be modified in a range of 4 to 20 μmol/min. In this case, the flow rates of the TMG and TMA must be simultaneously modified so that the Al structure is about w=0.2. The flow rate of $NH_3$ can be modified in a range of 3.3 to 5.5 LM. The thickness of the p-$Al_wGa_{1-w}N$ layer can be modified in a range of 20 to 60 nm.

Next, the ambient temperature is set to 870° C., TMG (flow rate: 18 μmol/min), $NH_3$ (flow rate: 4.4 LM), and CP2MG (bis-cyclopentadienyl Mg) as a dopant gas are fed, whereby a p layer 53 having thickness of about 200 nm and doped with Mg to $1\times10^{20}$ atom/$cm^3$ is formed. The flow rate of TMG can be modified in a range of 8 to 36 μmol/min. The flow rate of $NH_3$ can be modified in a range of 3.3 to 5.5 LM. The thickness of the p layer 53 can be modified in a range of 100 to 300 nm. The p layer 53 is subsequently activated by heat treatment for about 1 minute in a nitrogen atmosphere of about 900° C.

The device function layer is not limited to being composed of a light-emission operating layer as described above, and may be composed of a circuit operating layer having transistors or the like. In the present specification, a device function layer refers to a layer composed of a semiconductor that will be included in order for semiconductor elements to demonstrate the functions thereof. For example, in the case of a simple transistor, a structural layer composed of a p-n junction of an n-type semiconductor, p-type semiconductor, and n-type semiconductor (or a p-type semiconductor, n-type semiconductor, and a p-type semiconductor) is included. A semiconductor layer composed of a p-type semiconductor layer, a light-emission layer, and an n-type semiconductor layer, and that carries out the light-emission operation by re-coupling the injected carrier is particularly referred to as a light-emission operating layer.

(Support Substrate Bonding Step: Step S6)

Next, Pt (1 nm) and Ag (300 nm) are sequentially deposited on the p layer 53 by an EB technique or the like to form an electrode layer 61. The Pt layer assures ohmic contact between p layers 53, and the Ag layer assures high reflectivity. Next, Ti (100 nm), Pt (200 nm), and Au (200 nm) are sequentially deposited to form a bonding layer 62. The bonding layer 62 constitutes a bonding part to a later-described support substrate 70 (FIG. 3(h)).

Next, there is prepared a support substrate 70 for supporting the semiconductor epitaxial layers 50 in place of the sapphire substrate 10. For example, a Si single-crystal substrate, and copper or another metal substrate can be used as the support substrate 70. A bonding layer 71 has been previously formed by EB or the like on the support substrate 70, which consists of sequentially layered Pt, Ti, Ni, Au, and AuSn. Next, the bonding layer 71 of the support substrate 70 and the bonding layer 62 of the semiconductor epitaxial layers 50 are brought into close contact, so that the support substrate 70 is affixed (FIG. 4(i)) to the p layer 53 side of the semiconductor epitaxial layers 50 by thermocompression bonding in a vacuum or an $N_2$ atmosphere. The support substrate 70 may be formed by plating and growing Cu or another metal film on the semiconductor epitaxial layers 50.

(Growth Substrate Removal Step: Step S7)

Next, the wafer having passed through the steps described above is immersed in an aqueous solution of hydrofluoric acid (HF), the re-deposits 23 of $SiO_2$ deposited on the $SiO_2$ mask 20 and the non-mask part 22 are etched away and the sapphire substrate 10 is peeled away. Etchant flows into the cavities 41 in this wet etching treatment. In the wet etching treatment using HF, the $SiO_2$ is selectively etched away and the GaN film is left behind. The sapphire substrate 10 peels away when the $SiO_2$ mask 20, and the $SiO_2$ re-deposits 23 disposed between the sapphire substrate 10 and the GaN film are selectively etched away by the wet etching treatment. Even when peeling is not achieved at this stage, the sapphire substrate 10 is readily peeled away (FIG. 4(j)) by applying mechanical impact, thermal impact, ultrasonic waves, or another external force. Wet etching treatment is facilitated in the present step and the treatment can be carried out in a short period of time because adequate opening surface area of the cavities 41 as etchant introduction channels is assured.

The etchant to be used in the present wet etching treatment may be any etchant that dissolves $SiO_2$, and examples that can be used include BHF, a mixed solution of $NH_4F$ and HF, hot phosphoric acid, KOH, and NaOH.

After the present step, the surface of the GaN film exposed by the peeling away of the sapphire substrate 10 may be etched using KOH or the like, and a surface treatment may be carried out in order to form several hexagonal cone-shaped projections (so-called micro-cones) derived from the GaN crystalline structure on the peeling surface. Improvement of the light extraction efficiency can be assured by forming several concavities and convexities in the light extraction surface. The surface treatment may be carried out by dry etching using Ar plasma or a chloride-based plasma.

(Electrode Formation Step: Step S8)

Figure 4K:
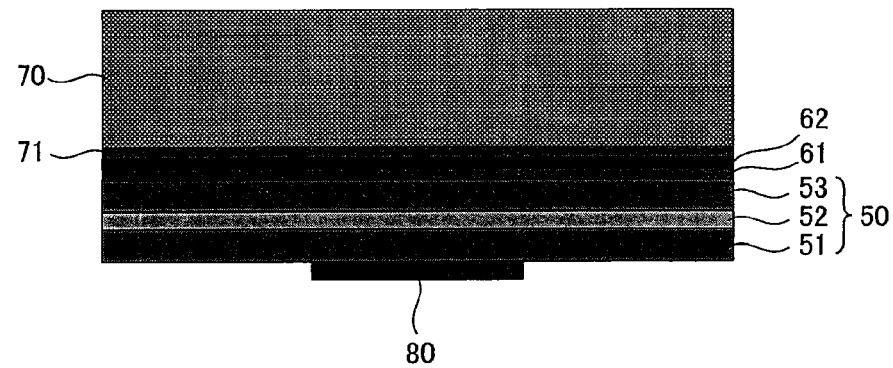

Next, Ti and Al are sequentially deposited by EB or the like on the surface of the GaN film exposed by the peeling away of the sapphire substrate 10, and an n-electrode 80 is formed (FIG. 4(k)) by depositing Ti/Au on the topmost surface in order to further improve bonding characteristics. Other than Ti/Al, it is also possible to use Al/Rh, Al/Ir, Al/Pt, Al/Pd, or the like as the electrode material.

(Chip Separation Step: Step S9)

Next, after the n-electrode 80 has been formed, the semiconductor epitaxial layers 50 supported by the support substrate are separated into individual chips. In this step, a resist pattern is formed firstly on the surface of the semiconductor epitaxial layers 50 so as to have grooves designed to provide boundaries between chips to be separated. Subsequently by using the grooves of the resist and a reactive ion etching, grooves are formed in the surface of the semiconductor epitaxial layers 50 each having a depth that reaches the electrode layer 61. The support substrate 70 and the like are thereafter diced and separated into chips along the grooves. A laser scribe or another technique may also be used. The semiconductor light-emitting device is completed via the steps described above.

Figure 6:
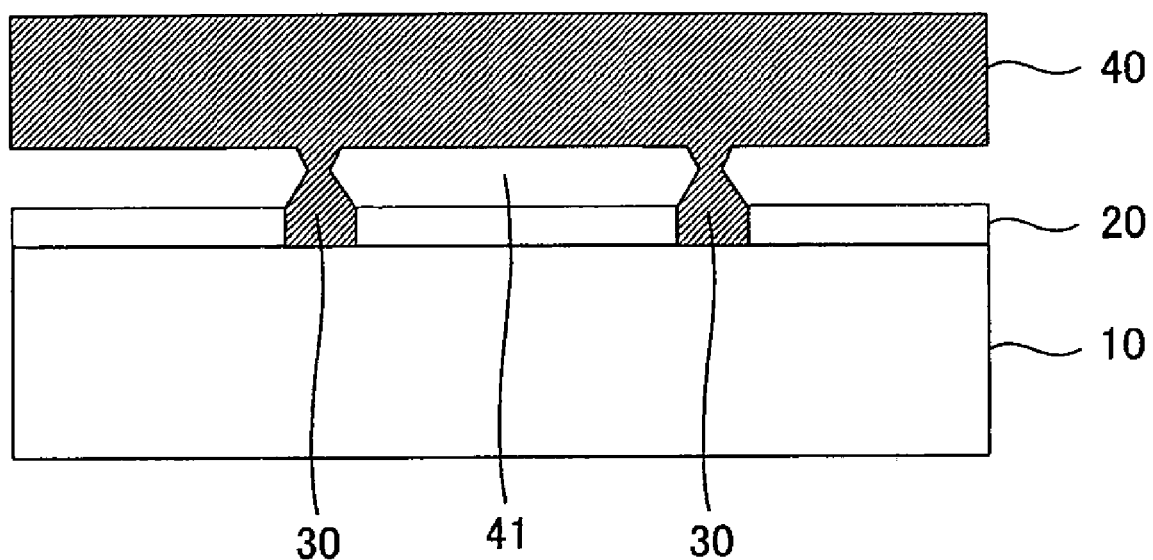
FIGS. 6(a) and 6(b) are cross-sectional views of a semiconductor device in which the surface area of the joining part of the sapphire substrate and the GaN film is reduced as an example of the present invention.
Figure 6:
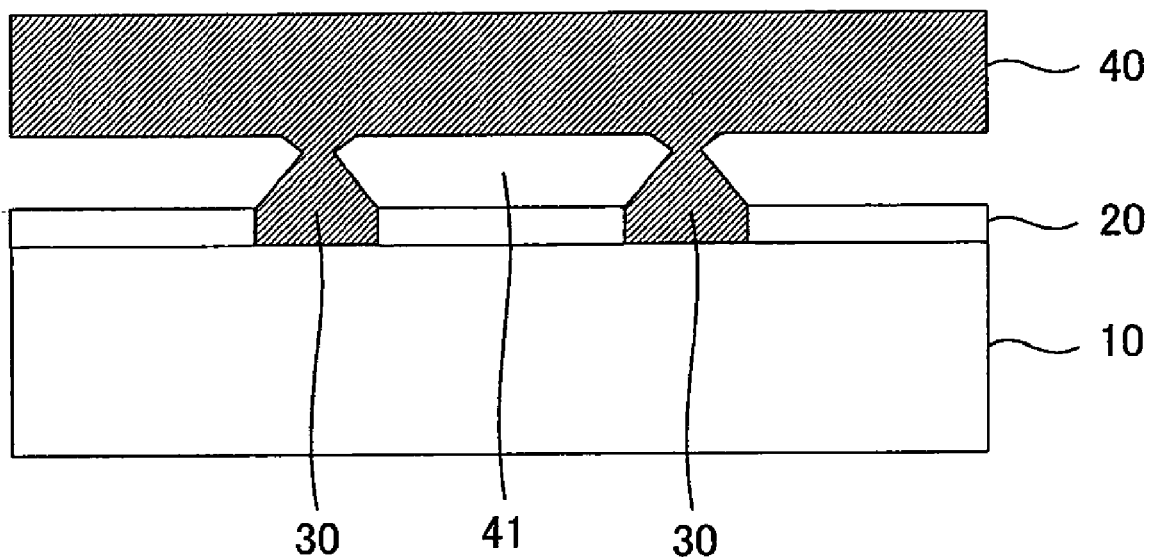

In the example described above, the cavities 41 function as etchant introduction channels, and the sapphire substrate 10 is peeled away by etching the $SiO_2$ mask 20 and the re-deposits 23 using wet etching. However, if the width of the partition wall part separating mutually adjacent cavities 41 is reduced, the joining surface area between the GaN film and the sapphire substrate 10 is also reduced, and the sapphire substrate 10 can therefore be mechanically peeled away by applying and external force. For example, the sapphire substrate 10 can be peeled away by imparting a light impact to the sapphire substrate 10. The sapphire substrate 10 can also be peeled away imparting vibrations to the wafer using ultrasonic waves or the like. The sapphire substrate 10 can furthermore be peeled away by immersing the cavities 41 in a fluid and using water vapor pressure produced by heating the fluid. The width of the non-mask part 22, which is the starting point of the GaN film growth, can be narrowed in order to reduce the surface area of the partition wall part between the cavities 41, as shown in FIG. 6(a). The width of the low-temperature buffer layer 30 for starting the growth from the non-mask part 22 is reduced, so the joining surface area is also reduced. The surface area of the joining port can be reduced by increasing the thickness of the low-temperature buffer layer 30, as shown in FIG. 6(b). This is due to the fact that the slope angle of the facet {11-20} exposed on the surface of the low-temperature buffer layer 30 is constant and the width of the distal end part narrows as the thickness increases.

The thickness of the device functional layer 50 and the support substrate 70 must be considered in order to mechanically peel away the sapphire substrate 10 by the application of external force rather than by wet etching. The thickness of the $SiO_2$ mask and low-temperature buffer layer can be adjusted so that the in-plane occupancy ratio of the surface area of the joining part is about 10%. Thus, the wet etching treatment in the re-deposition layer formation step (step S2) and the growth substrate-peeling step (step S7) can be omitted in the example described above in the case that the sapphire substrate 10 can be mechanically peeled away by the application of an external force.

(Research Results)

Figure 7:
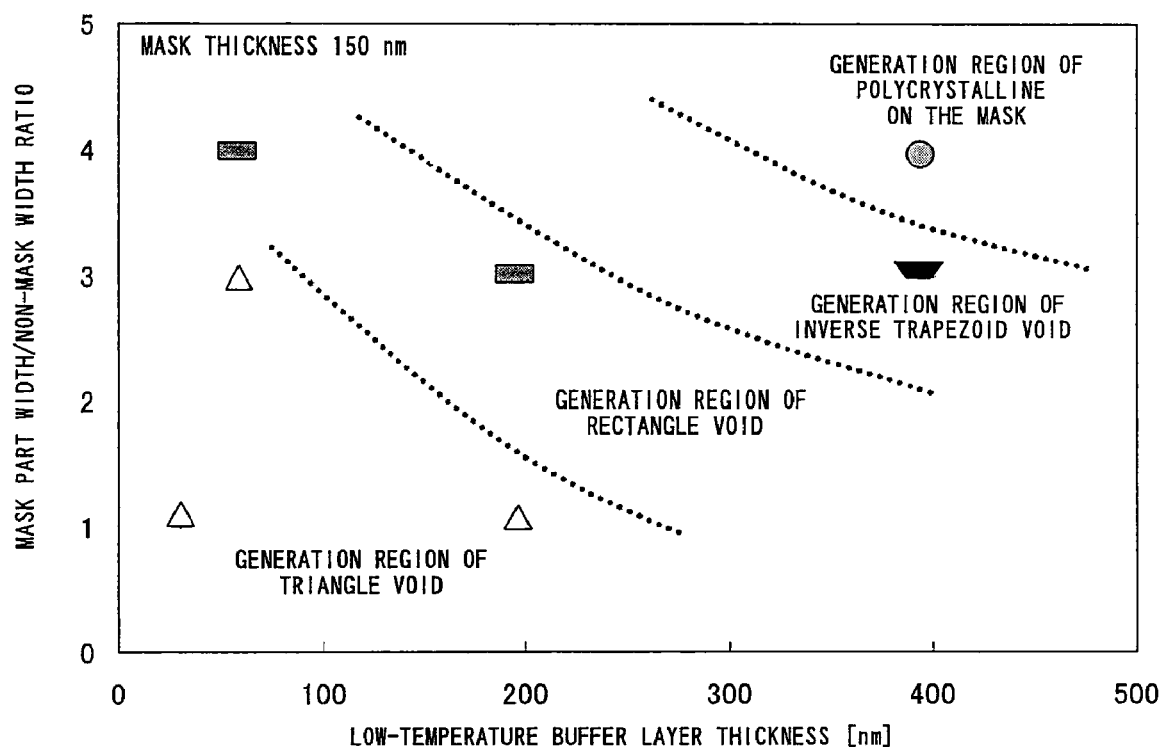
FIG. 7 is a view showing the relationship between the cavity shape and the manufacturing conditions.

FIG. 7 shows the relationship between the cross-sectional shape of the cavities 41 and the parameters of the present example described above as a graph. The thickness of the low-temperature buffer layer 30 is shown on the horizontal axis of the graph, and the ratio between the width of the mask part 21 and the width of the non-mask part 22 (hereinbelow referred to as "mask ratio") is shown on the vertical axis of the graph. The cavity shapes of samples fabricated by varying the parameters were correlated with plot shapes and plotted. The thickness of each $SiO_2$ mask was 150 nm.

As shown in the graph, a trend was confirmed that as the shape of the cavities 41 changes to a triangle, a rectangle, and a trapezoid, the mask ratio increases. A trend was also confirmed that as the cross-sectional shape of the cavities 41 changes to a triangle, a rectangle, and a trapezoid, the thickness of the low-temperature buffer layer 30 increases. It was also confirmed that when the mask ratio of the buffer layer becomes excessively high, GaN polycrystals are generated on the mask, and the cavities 41 become blocked by the GaN polycrystals. This is thought to be due to the fact that when the mask width is increased, seed material is fed in large quantities on the mask for a relatively long period of time in which the GaN crystals for covering the upper part of the mask grow, and the generation speed of the GaN polycrystals exceeds the desorption speed.

Figure 8:
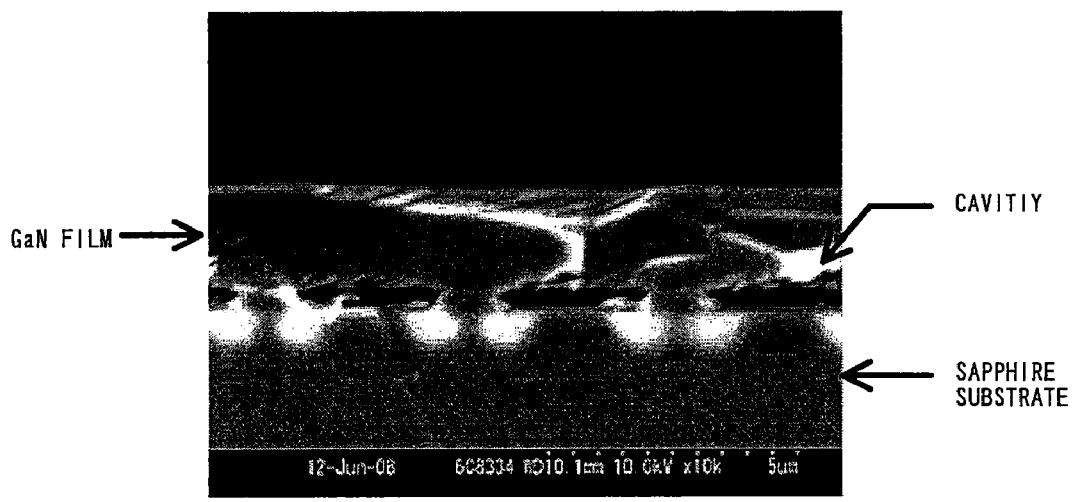
FIG. 8 is an SEM image of a cross-section of the semiconductor light-emitting device fabricated using the manufacturing method of the present invention.

As described above, the shape of the cavities 41 is preferably a trapezoidal shape, which can maximize the opening surface area and width in the case that the cavities 41 are used for peeling away the sapphire substrate 10. The thickness of the low-temperature buffer layer 30 is made greater than the thickness of the $SiO_2$ mask 20 and the facet {11-22} is exposed, after which the growth of the GaN film carried out at relatively low growth speed and the growing of the GaN film carried out at relatively high growth speed are repeated in alternating fashion, thereby making it possible to form trapezoid-shaped cavities that are advantageous for peeling away the sapphire substrate in the wet etching and mechanical treatments. FIG. 8 is an SEM image of a cross-section of the semiconductor light-emitting device fabricated using the manufacturing method of the present invention.

Comparative Example

A semiconductor light-emitting device fabricated using a manufacturing method that is different from the manufacturing method of the example described above is described below as a comparative example in order to make the operation and effects of the manufacturing method of the example described above more apparent.

The manufacturing method of the example described above makes the shape of the cavities substantially trapezoidal and assures the opening surface area of the cavities by making the thickness of the low-temperature buffer layer to be greater than the thickness of the $SiO_2$ mask and exposing the facet {11-22} of the GaN crystals. In contrast, the case in which the thickness of the low-temperature buffer layer is made less than the thickness of the $SiO_2$ mask is described below with reference to FIG. 9.

Figure 9A:
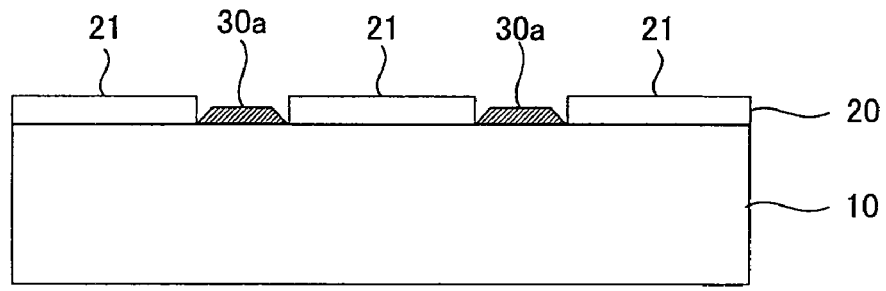
FIGS. 9(a) through 9(d) are cross-sectional views of each of the manufacturing steps of the semiconductor light-emitting device fabricated using a different method from the manufacturing method of the present invention.
Figure 9B:
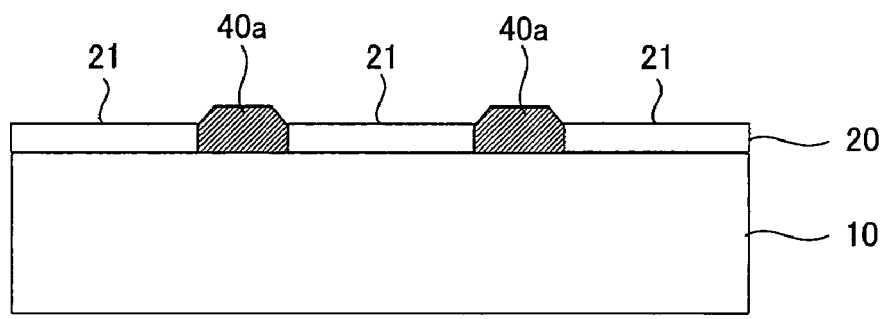
Figure 9C:
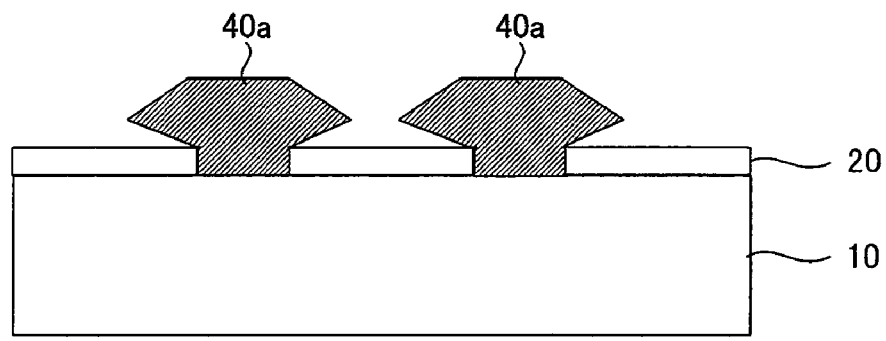
Figure 9D:
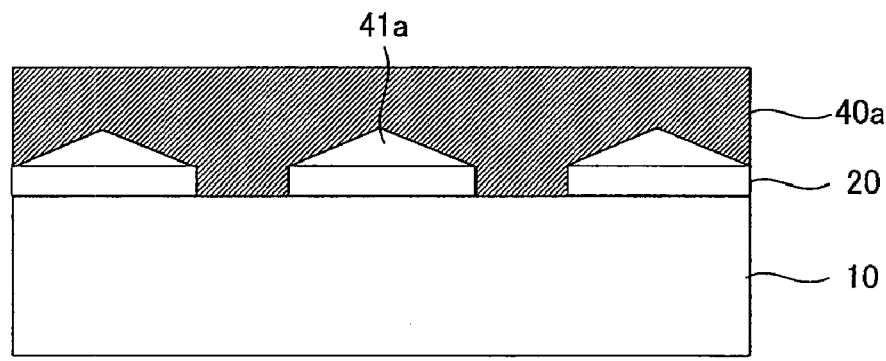

FIG. 9(a) shows the state in which a low-temperature buffer layer 30 is formed thinner than the $SiO_2$ mask 20 on the sapphire substrate 10.

Figure 10:
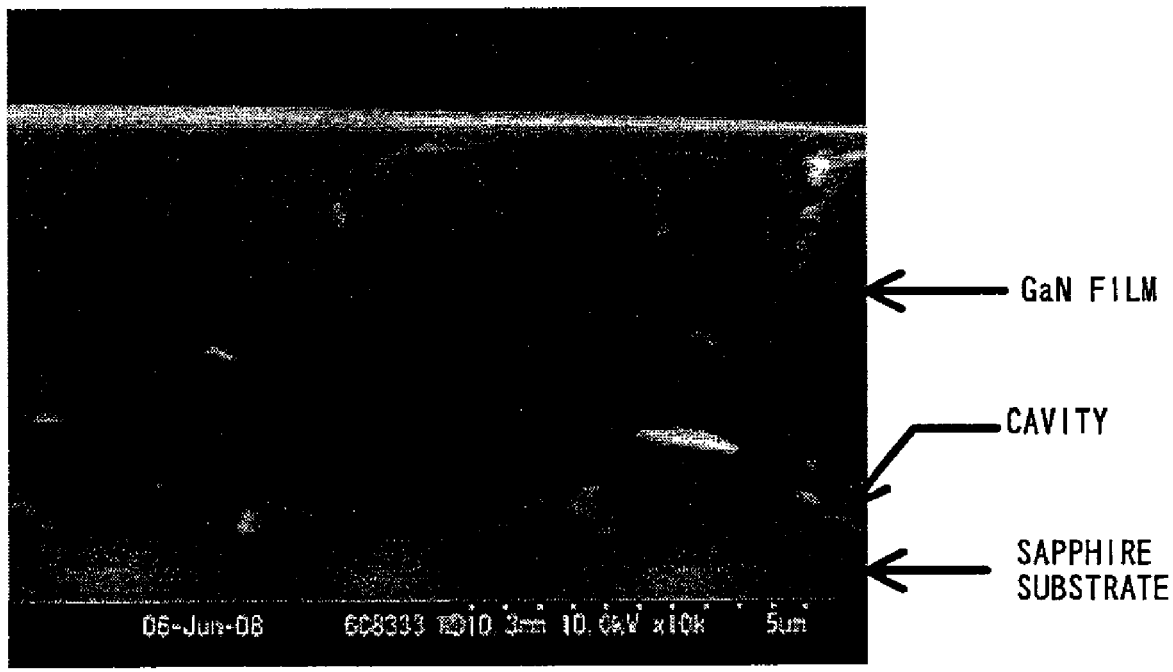
FIG. 10 is an SEM image of a cross-section of the semiconductor light-emitting device fabricated using a different method from the manufacturing method of the present invention.

In this state, first, growth occurs in the vertical direction of the low-temperature buffer layer 30a when the GaN film is grown under the same conditions as those in the cavity formation step (step S4) of the example described above. Then, lateral growth starts when the GaN film grows to a height that exceeds the thickness of the $SiO_2$ mask 20. Here, the facet is not exposed as in the example described above in the portion that corresponds to the cavity sidewall part. Also, the lower surface portion of the lateral growth layer 40a has poor crystallinity and therefore peels away (FIG. 9(c)). When the growth continues further, mutually adjacent GaN crystals fuse together around the mask part 21, and substantially triangular cavities 41a are formed on the mask part 21 (FIG. 9(d)). FIG. 10 is an SEM image of a cross-section of the semiconductor light-emitting device fabricated in accordance with the present comparative example. Accordingly, the surface area and width of the openings of the cavities are smaller than in the example described above when the thickness of the low-temperature buffer layer is less than that of the $SiO_2$ mask, and the surface area.

On the other hand, in the manufacturing method of the example described above, the low-temperature buffer layer 30 is formed to a greater thickness than that of the $SiO_2$ mask 20, the facet {11-22} of the GaN is exposed by a later heat treatment, and lateral growth is then carried out. Since the facet is maintained even in the lateral growth process, the shape of the cavities is substantially trapezoidal, and the surface area and width of the openings of the cavities can be assured.

Next, the cavity formation step is described with reference to FIG. 11 for the case in which the growth speed of the GaN film is constant.

Figure 11A:
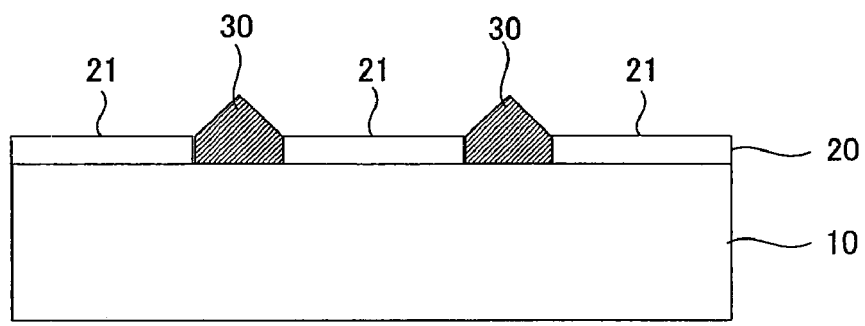
FIGS. 11(a) through 11(d) are cross-sectional views of each manufacturing step of the semiconductor light-emitting device fabricated using a different method from the manufacturing method of the present invention.
Figure 11B:
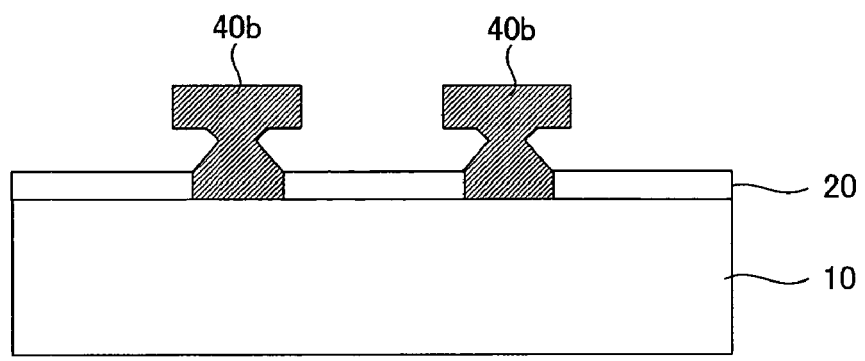
Figure 11C:
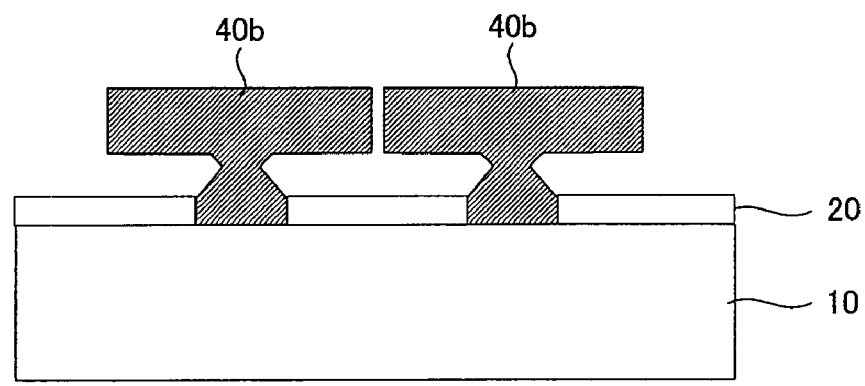
Figure 11D:
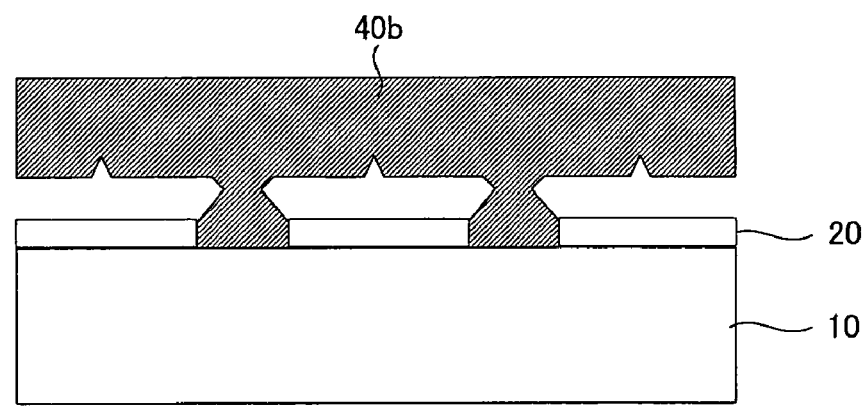

FIG. 11(a) shows the state in which low-temperature buffer layer 30 is formed on the sapphire substrate 10 via the same treatment as that of the low-temperature buffer layer formation step (step S3) of the present example. The GaN film is grown from this state using only a treatment that corresponds to step 2 of the present example in which the growth rate is relatively high. In this case, a treatment that corresponds to the first step of the present example in which desorption of the seed material is facilitated is not carried out. Therefore, the facet {11-22} is not exposed on the end face of the GaN crystals that spread out in the lateral direction (FIGS. 11(b) and 11(c)). When growth is continued further, the mutually adjacent GaN crystals fuse together and the cavities 41b are formed, and the cavities 41b have projection-shaped concavities in the center area (FIG. 11(d)). The gap between the crystals narrows just before the GaN crystals fuse together, making it difficult for the seed material to reach the lower part of the GaN film. As a result, only the upper part fuses together and such projection-shaped concavities are formed in the GaN film because growth is not facilitated in the portions where the seed material is not fed. When such projection-shaped concavities are formed in the GaN film, the mechanical strength is reduced and cracks are liable to appear starting at the distal end parts of the projections.

On the other hand, in the manufacturing method of the present example, treatment in which growth is carried out with a relatively low growth speed (first step) and a treatment in which growth is carried out with a relatively high growth speed (second step) are performed a plurality of cycles in alternating fashion to grow the GaN film in the lateral direction. In the first step, the facet {11-22} is exposed on the end face of the GaN crystals that spread out in the lateral direction because desorption of the seed material is facilitated. Therefore, projection-shaped concavities are not formed in the cavities because the lower parts of the GaN film fuse together first (FIG. 2(e)).

It is apparent from the description above that, in accordance with the method for manufacturing a semiconductor element of the present invention, cavities having openings with a large surface area and width can be formed inside the GaN film, sufficiently demonstrate function as etchant introduction channels, and also allow the growth substrate to mechanically peel away. Therefore, the sapphire substrate 10 can be peeled away by applying an external force or by wet etching without the use of LLO. Introduction of a high cost LLO apparatus is not required, and semiconductor cracking and other problems that occur due to the growth substrate being peeled away by LLO can be avoided. In the growth substrate-peeling step, batch processing of a plurality of wafers is facilitated, and productivity can be improved.

Processing is not laborious because the cavities are formed in the growth stage of the GaN film, and an increase in the processing time can be avoided. Since the sapphire substrate can be peeled away by removing the $SiO_2$, HF or the like can be used as the etchant, and the sapphire substrate can be peeled away without etching the GaN film. Therefore, the thickness of the GaN film is not required to be increased in anticipation of etching the GaN film, and the processing time is not increased. Also, in accordance with the technique of the present invention in which the sapphire substrate is peeled away by dispersing the $SiO_2$ re-deposits in island shapes on the sapphire substrate 10 and the re-deposits are used as a sacrificial film, existing growing conditions can be used without modification because the GaN film can be grown from a sapphire substrate, and a GaN film is readily formed having higher crystallinity than the case in which growth is carried out from a separation layer, as in Japanese Laid-open Patent Application No. 2001-36139.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2008-321140 which is hereby incorporated by reference.

What is claimed is:

1. A method for manufacturing a semiconductor device using an organometallic vapor phase growth method, comprising
    a step for forming on a growth substrate a selective growth mask for partially covering said growth substrate;
    a step for forming a buffer layer with a greater thickness than that of said mask and having a facet on the surface, in the non-mask part that is not covered by said mask on said growth substrate;
    a cavity formation step for growing a lateral growth layer on said buffer layer and forming cavities on the upper part of said mask; and
    a step for epitaxially growing a device function layer on said lateral growth layer,
    wherein said cavity formation step includes a first step for growing a semiconductor film at a growth rate and a second step for growing another semiconductor film at another growth rate mutually different from the first growth rate,
    wherein the first and second steps are carried out a plurality of times in alternating fashion.

2. The method for manufacturing a semiconductor device of claim 1, wherein said buffer layer, said lateral growth layer, and said device function layer have a group III nitride semiconductor, and the facet of said buffer layer is the {11-22} plane of said group III nitride semiconductor crystal.

3. The method for manufacturing a semiconductor device of claim 1, wherein the facet of said buffer layer is formed using a heat treatment after said buffer layer has been grown.

4. The method for manufacturing a semiconductor device of claim 1, wherein said growth substrate is a c-plane sapphire substrate, and said mask is formed so as to have a side parallel to the <11-20> direction of the crystal orientation of said sapphire substrate.

5. The method for manufacturing a semiconductor device of claim 4, wherein said mask has a striped pattern in which the mask part and the non-mask part are arranged in alternating fashion.

6. The method for manufacturing a semiconductor device of claim 1, wherein the ratio of the growth rates of the semiconductor film in said first step and said second step is 1:1.5 to 1:4.

7. The method for manufacturing a semiconductor device of claim 1, wherein said device function layer is a light-emission operating layer having a light-emission layer.

8. The method for manufacturing a semiconductor device of claim 1, further comprising:
    a step for bonding a support substrate to said device function layer; and
    a step for mechanically removing said growth substrate using a partition wall part between said cavities as a starting point.

9. The method for manufacturing a semiconductor device of claim 1, further comprising:
    a step for forming a re-disposition layer in which the constituent material of said mask is desorbed before said buffer layer is formed, and re-deposited on said non-mask part on said growth substrate;
    a step for bonding a support substrate to said device function layer; and
    a step for causing etchant to flow into said cavities to remove said mask and said re-deposition layer, and to peel away said growth substrate.

10. A semiconductor device in which a device function layer having a group III nitride semiconductor is formed on a growth substrate, the semiconductor device comprising a cavity-containing layer having a group III nitride semiconductor that has a plurality of cavities between said growth substrate and said device function layer, wherein each of said cavities has a sidewall having the {11-22} plane of said group III nitride semiconductor crystal.

* * * * *